(12) United States Patent
Fuchita et al.

(10) Patent No.: US 9,752,227 B2
(45) Date of Patent: Sep. 5, 2017

(54) DEPOSITION METHOD

(71) Applicant: Fuchita Nanotechnology Ltd., Chiba (JP)

(72) Inventors: Eiji Fuchita, Chiba (JP); Eiji Tokizaki, Chiba (JP); Eiichi Ozawa, Chiba (JP)

(73) Assignee: FUCHITA NANOTECHNOLOGY LTD., Chiba (JP)

( * ) Notice: Subject to any disclaimer, the term of this patent is extended or adjusted under 35 U.S.C. 154(b) by 104 days.

(21) Appl. No.: 14/626,220

(22) Filed: Feb. 19, 2015

(65) Prior Publication Data

US 2015/0376771 A1 Dec. 31, 2015

(30) Foreign Application Priority Data

Jun. 25, 2014 (JP) .................................. 2014-130348
Dec. 22, 2014 (JP) .................................. 2014-258652

(51) Int. Cl.

| B05D 1/00 | (2006.01) |
| C23C 14/34 | (2006.01) |
| H01J 37/34 | (2006.01) |
| C09D 5/00 | (2006.01) |
| C23C 24/02 | (2006.01) |
| B05D 1/12 | (2006.01) |
| B05D 1/06 | (2006.01) |

(52) U.S. Cl.
CPC ............... *C23C 14/34* (2013.01); *C09D 5/00* (2013.01); *C23C 24/02* (2013.01); *H01J 37/3411* (2013.01); *B05D 1/007* (2013.01); *B05D 1/06* (2013.01); *B05D 1/12* (2013.01)

(58) Field of Classification Search
CPC ............. B05D 1/12; B05D 1/06; B05D 1/007
See application file for complete search history.

(56) References Cited

U.S. PATENT DOCUMENTS

| 4,319,890 A | 3/1982 | Teller et al. |
| 2008/0003458 A2 | 1/2008 | Iwata et al. |
| 2014/0004260 A1 | 1/2014 | Fuchita et al. |

FOREIGN PATENT DOCUMENTS

| DE | 9315890 U1 | 3/1994 |
| JP | 3558970 B2 | 8/2004 |
| JP | 3994895 B2 | 10/2007 |

(Continued)

OTHER PUBLICATIONS

European Search Report dated Oct. 23, 2015 in European Application No. 15168657.3.

*Primary Examiner* — Xiao Zhao
(74) *Attorney, Agent, or Firm* — Saliwanchik, Lloyd & Eisenschenk

(57) ABSTRACT

A deposition method includes: introducing a gas into an airtight container containing electrically insulated raw material particles to generate an aerosol of the raw material particles; transferring the aerosol to a deposition chamber through a transfer tubing connected to the airtight container, the deposition chamber having a pressure maintained to be lower than that of the airtight container; injecting the aerosol from a nozzle mounted on a tip of the transfer tubing toward a target placed on the deposition chamber to cause the raw material particles to collide with the target, thereby causing the raw material particles to be positively charged; generating fine particles of the raw material particles by discharge of the charged raw material particles; and depositing the fine particles on a substrate placed on the deposition chamber.

5 Claims, 5 Drawing Sheets

(56) References Cited

FOREIGN PATENT DOCUMENTS

| | | | |
|---|---|---|---|
| JP | 2009249720 | A | 10/2009 |
| JP | 2014009368 | A | 1/2014 |
| WO | WO-2012081053 | A1 | 6/2012 |

DEPOSITION METHOD

CROSS-REFERENCE TO RELATED APPLICATIONS

This application claims the benefit under 35 U.S.C. §119 of Japanese Patent Application Nos. 2014-130348, filed Jun. 25, 2014 and 2014-258652, filed Dec. 22, 2014, which are herein incorporated by reference in their entirety.

BACKGROUND OF THE INVENTION

The present disclosure relates to a deposition method and a deposition apparatus that use an aerosol gas deposition method, and to a structure prepared using the method.

An aerosol gas deposition method in which submicron-sized particles of ceramic or the like are injected from a nozzle at ambient temperature and are deposited on an opposite substrate has been known. This deposition method is being used at present in wide application fields such as thin film preparation and thick film preparation.

The applicant of the subject patent application has already proposed a deposition method that is capable of forming a dense film using fine particles having a relatively large particle diameter (see WO 2012/081053 and Japanese Patent Application Laid-open No. 2014-9368). This deposition method causes raw material fine particles to be charged by friction with the inner surface of a transfer tubing and deposits the charged fine particles on a substrate while transferring an aerosol to a deposition chamber. With this method, it is possible to reliably form a film having an excellent density and adhesiveness.

BRIEF SUMMARY

In recent years, it is an important development item to improve the insulating properties and adhesiveness of a coating film in designing of laminated device, in a field of thin-film electronic device, for example. In particular, a thin coating film having a high dielectric strength is expected to be developed.

In view of the circumstances as described above, it is desirable to improve the density and adhesiveness of a formed film and to provide a deposition method and deposition apparatus that are capable of forming an insulating film having a high dielectric strength even if the insulating film is thin, and a structure including such an insulating film.

According to an embodiment of the present disclosure, there is provided a deposition method including introducing a gas into an airtight container containing electrically insulated raw material particles to generate an aerosol of the raw material particles. The aerosol is transferred to a deposition chamber through a transfer tubing connected to the airtight container, the deposition chamber having a pressure maintained to be lower than that of the airtight container. The aerosol is injected from a nozzle mounted on a tip of the transfer tubing toward a target placed on the deposition chamber to cause the raw material particles to collide with the target, thereby causing the raw material particles to be positively charged. Fine particles of the raw material particles are generated by discharge of the charged raw material particles. The fine particles are deposited on a substrate placed on the deposition chamber.

The above-mentioned deposition method forms a film by causing an aerosol of raw material particles injected from a nozzle to collide with a target to cause the raw material particles to be positively charged, generating fine particles of the raw material particles by discharge of the charged raw material particles, and causing the fine particles to enter and collide with the substrate. The discharge of the raw material particles typically generates plasma of the gas in the deposition chamber, in the vicinity of the target. In the plasma, cations of gas molecules sputter the surface of incoming (neutral) particles and thus, nano-sized particles are generated.

The substrate is typically connected to a ground potential. Many of the fine particles are electrically charged. The charged fine particles are attracted to the substrate by electrical interaction with the substrate, and are deposited with electrostatic adsorption with the surface of the substrate. Therefore, a dense coating film having an excellent adhesive force to the substrate is formed. On the other hand, electrically neutral raw material particles having a relatively large particle diameter do not reach the surface of the substrate and are ejected to the outside of the deposition chamber through the gas stream. In this way, nano-sized particles of the raw material particles are deposited on the substrate. Accordingly, a dense insulating film having a high adhesiveness is formed on the substrate.

The material constituting the raw material particles is not particularly limited. For example, various insulating materials such as alumina (aluminum oxide), aluminum nitride, and barium titanate are used. In addition, the raw material particles may have a structure in which an insulating film is formed on the surface of a conductor. The particle diameter of the raw material particles is not also particularly limited. For example, raw material particles having a particle diameter of not less than 0.1 μm and not more than 10 μm are used.

These raw material particles are positively charged by collision with the target, and can generate discharge between the particles and the substrate maintained at ground potential.

In the deposition chamber, the substrate is arranged on an axis line that passes through an irradiation surface of the target to which the aerosol is applied and is in parallel with the irradiation surface. Accordingly, it is possible to introduce the raw material particles charged by collision with the irradiation surface onto the substrate through gas flow. As a result, it is possible to form a dense film not including raw material particles having a large particle diameter but including raw material particles having a fine particle diameter.

Moreover, by reciprocating the substrate in the in-plane direction during deposition, it is possible to form a coating film in a desired area on the surface of the substrate.

As the material constituting the target, a metal material such as stainless steel and copper or a conductive material such as graphite can be used. These conductive materials are likely to be negatively charged as compared with the raw material particles. Therefore, it is possible to effectively cause the raw material particles to be positively charged.

The gas introduced into the airtight container has a function to generate an aerosol of the raw material particles and a function as a carrier gas to transfer the raw material particles to the deposition chamber. As such a gas, nitrogen, argon, or the like, is typically used. However, a mixed gas obtained by mixing any one of these gases with oxygen may be used, or only oxygen may be used.

Because argon has a lower discharge voltage than nitrogen, the efficiency of sputtering the raw material particles is improved. Accordingly, it is possible to improve the deposition rate.

In the case where the raw material particles include an oxide, oxygen defect tends to be generated due to the sputtering operation of ions in plasma. Under the presence of oxygen, however, oxygen defect of the raw material particles is reduced. Accordingly, it is possible to ensure the oxygen concentration in the film and to form a thin film having an excellent dielectric strength, for example.

According to an embodiment of the present disclosure, there is provided a deposition apparatus including a generation chamber, a deposition chamber, a transfer tubing, a target, and a stage. The generation chamber is configured to be capable of generating an aerosol of raw material particles. The deposition chamber is configured to be capable of having a pressure maintained to be lower than that of the generation chamber. The transfer tubing is configured to connect the generation chamber and the deposition chamber and include a nozzle configured to inject the aerosol at an end portion thereof. The target is arranged in the deposition chamber, has an irradiation surface that is irradiated with the aerosol injected from the nozzle, and is configured to cause the raw material particles to be positively charged by collision of the raw material particles with the irradiation surface. The stage is configured to support a substrate on which fine particles of the raw material particles generated by discharge of the charged raw material particles are deposited, the substrate being arranged on an axis line that passes through the irradiation surface and is in parallel with the irradiation surface.

According to the present disclosure, it is possible to form a coating film having a high density and adhesiveness.

These and other objects, features and advantages of the present disclosure will become more apparent in light of the following detailed description of best mode embodiments thereof, as illustrated in the accompanying drawings.

DETAILED DESCRIPTION

Hereinafter, an embodiment of the present disclosure will be described with reference to the drawings.

Deposition Apparatus

Figure 1:
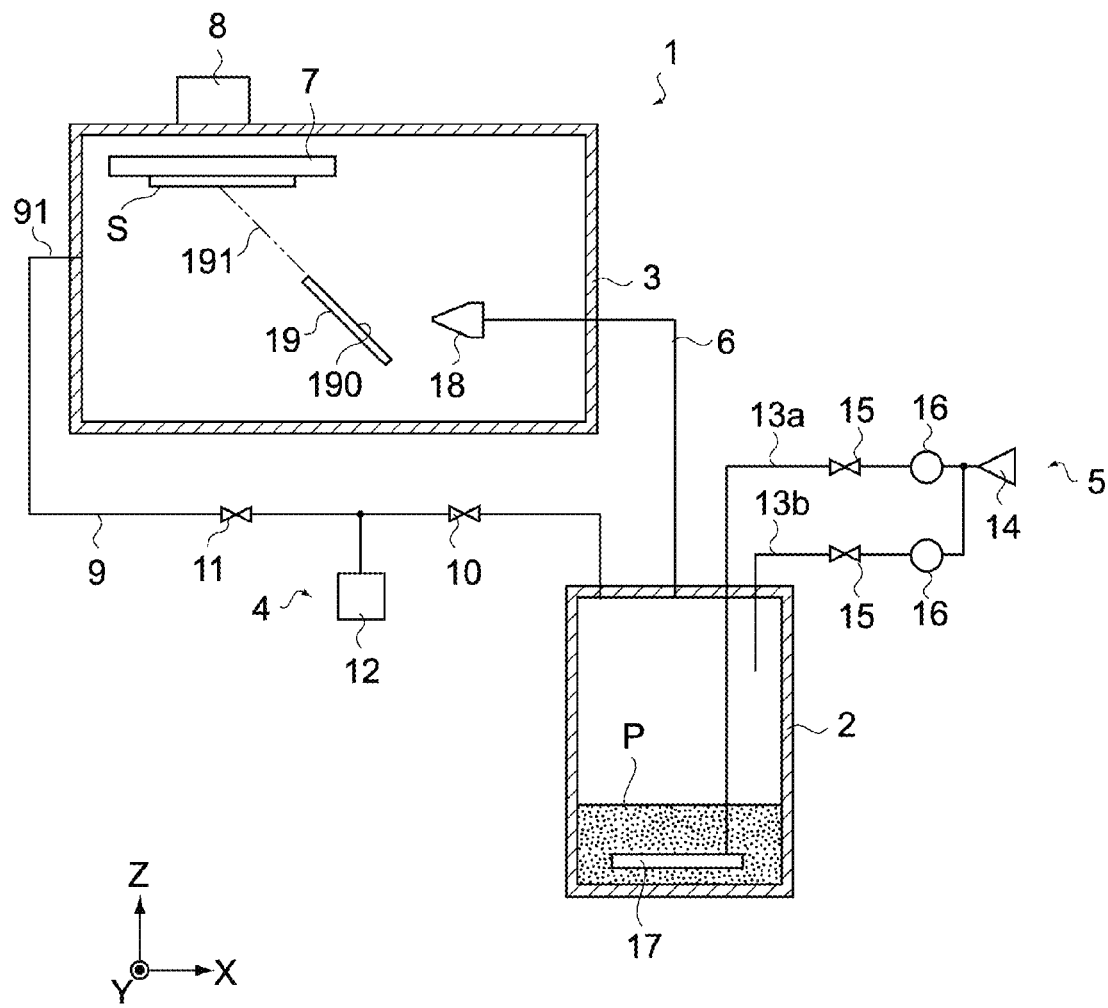
FIG. 1 is a schematic configuration diagram of a deposition apparatus according to an embodiment of the present disclosure.

FIG. 1 is a schematic configuration diagram of a deposition apparatus according to an embodiment of the present disclosure. The deposition apparatus according to this embodiment constitutes an aerosol gas deposition (AGD) apparatus. In FIG. 1, X-axis, Y-axis, and Z-axis directions represent triaxial directions orthogonal to each other, and the Z-axis direction represents a vertical direction (the same shall apply to the following figures).

As shown in FIG. 1, a deposition apparatus 1 includes a generation chamber 2, a deposition chamber 3, and a transfer tubing 6. An aerosol of raw material particles P is generated in the generation chamber 2, the deposition chamber 3 contains a substrate S on which a deposition process is performed, and the aerosol is transferred from the generation chamber 2 to the deposition chamber 3 through the transfer tubing 6.

The generation chamber 2 and the deposition chamber 3 are formed independently, and the internal spaces of the chambers are connected to each other through the inside of the transfer tubing 6. The deposition apparatus 1 includes an evacuation system 4 connected to the generation chamber 2 and the deposition chamber 3, and is configured to be capable of evacuating the respective atmospheres of the chambers to a predetermined reduced pressure atmosphere and maintaining the atmosphere. The generation chamber 2 further includes a gas supply system 5 connected to the generation chamber 2, and is configured to be capable of supplying a carrier gas to the generation chamber 2.

The generation chamber 2 contains the raw material particles P being aerosol raw materials, and an aerosol is generated therein. The generation chamber 2 is connected to a ground potential, and is formed of an airtight container including glass, for example. In addition, the generation chamber 2 includes a lid portion (not shown) for taking in and out the raw material particles P. The deposition apparatus 1 may further include a vibration mechanism that vibrates the generation chamber 2 to agitate the raw material particles P or a heating mechanism that degasses (removes water or the like of) the raw material particles P.

The raw material particles P are aerosolized in the generation chamber 2, and is deposited on the substrate S in the deposition chamber 3. The raw material particles P include fine particles formed of a material being a deposition target. In this embodiment, as the raw material particles P, alumina (aluminum oxide) fine particles are used.

It should be noted that other than that, other electrically insulated ceramic particles such as aluminum nitride and barium titanate can be applied to the raw material particles P. Moreover, the raw material particles P may have a structure in which an insulating film is formed on the surface of a conductor. The particle diameter of the raw material particles P is not particularly limited. For example, those having a particle diameter of not less than 0.1 μm and not more than 10 μm are used.

In the deposition chamber 3, a stage 7 that is configured to hold the substrate S is movably arranged. Outside the deposition chamber 3, a stage drive mechanism 8 that is configured to move the stage 7 is provided. The stage drive mechanism 8 is configured to be capable of reciprocating the stage 7 in a direction in parallel with the deposition surface of the substrate S at a predetermined speed in the deposition chamber 3. In this embodiment, the stage drive mechanism 8 is configured to be capable of moving the stage 7 linearly along the X-axis direction.

The substrate S includes glass, metal, ceramic, a silicon substrate, or the like. The AGD method can form a film at ambient temperature, and is a physical deposition method without a chemical process. Therefore, it is possible to select various materials as the substrate. Moreover, the substrate S is not limited to a flat substrate, and may be a three-dimensional substrate.

The deposition chamber 3 and the stage 7 are each connected to a ground potential. The stage 7 may include a heating mechanism that is configured to degas the substrate S before deposition. Moreover, in the deposition chamber 3, a vacuum gauge that designates the internal pressure may be provided. The deposition chamber 3 is maintained at a pressure lower than that of the generation chamber 2.

The evacuation system 4 is configured to vacuum-evacuate the generation chamber 2 and the deposition chamber 3. The evacuation system 4 includes a vacuum piping 9, a first valve 10, a second valve 11, and a vacuum pump 12. The vacuum piping 9 includes a branch piping that connects the vacuum pump 12, the generation chamber 2, and the deposition chamber 3 to each other. The first valve 10 is arranged between the branch point of the vacuum piping 9 and the generation chamber 2, and the second valve 11 is arranged between the branch point of the vacuum piping 9 and the deposition chamber 3. The configuration of the vacuum pump 12 is not particularly limited. For example, the vacuum pump 12 includes a multiple stage pump unit. The multiple stage pump unit includes a mechanical booster pump and a rotary pump.

The gas supply system 5 is configured to supply a carrier gas to the generation chamber 2. The carrier gas defines the pressure in the generation chamber 2 and is used to generate an aerosol. As the carrier gas, $N_2$, Ar, He, $O_2$, dry air, or the like, is used. The gas supply system 5 includes gas pipings 13a and 13b, a gas source 14, third valves 15, gas flowmeters 16, and a gas injection body 17. The third valves 15 are arranged in the gas pipings 13a and 13b. The gas flowmeters 16 are arranged in the gas pipings 13a and 13b.

The gas source 14 includes a gas cylinder, for example, and is configured to supply a carrier gas. The gas source 14 is connected to the gas injection body 17 through the gas piping 13a. The gas piping 13b is formed by branching from a gas piping 13, and the tip of the gas piping 13b is arranged in the generation chamber 2. The carrier gas supplied to the generation chamber 2 through the gas piping 13a is mainly used to roll up the raw material particles P. The carrier gas supplied to the generation chamber 2 through the gas piping 13b is mainly used to control the gas pressure in the generation chamber 2.

The gas injection body 17 is arranged in the generation chamber 2, and is configured to uniformly inject the carrier gas supplied from the gas piping 13. The gas injection body 17 may be a hollow body in which many gas injection holes are provided, for example, and is arranged at a position where the gas injection body 17 is covered by the raw material particles P, e.g., at the bottom of the generation chamber 2. Accordingly, it is possible to efficiently roll up the raw material particles P by the carrier gas, and to aerosolize it. The gas flowmeter 16 is configured to designate the flow rate of the carrier gas flowing through the gas pipings 13a and 13b. The valve 15 is configured to be capable of adjusting the flow rate of the carrier gas flowing through the gas pipings 13a and 13b and blocking the carrier gas.

The transfer tubing 6 is configured to use the internal pressure difference between the generation chamber 2 and the deposition chamber 3 to transfer the aerosol generated in the generation chamber 2 to the deposition chamber 3. One end of the transfer tubing 6 is connected to the generation chamber 2. The other end (tip portion) of the transfer tubing 6 is arranged in the deposition chamber 3, and includes a nozzle 18 configured to inject an aerosol. The transfer tubing 6 and the nozzle 18 are connected to a ground potential.

The nozzle 18 includes a metal material such as stainless steel. The inner surface of the passage of the nozzle 18 through which an aerosol passes may be covered by a carbide material. Accordingly, it is possible to reduce attrition due to collision with the fine particles constituting the aerosol, and to improve the durability. Examples of the carbide material include titanium nitride (TiN), titanium carbide (TiC), tungsten carbide (WC), and diamond-like carbon (DLC).

The inner surface of the transfer tubing 6 is formed of a conductor. As the transfer tubing 6, a linear metal pipe such as a stainless pipe is typically used. The length and inner diameter of the transfer tubing 6 can be appropriately set, and are 300 mm to 2000 mm and 4.5 mm to 24 mm, respectively, for example.

The opening shape of the nozzle 18 may be a circular shape or a slot shape. In this embodiment, the opening shape of the nozzle 18 is a slot shape, and the length of the opening is not less than 10 times and not more than 1,000 times as large as the width of the opening. In the case where the ratio of the length to the width of the opening is less than 10 times, it is difficult to effectively cause particles to be charged in the nozzle. On the other hand, in the case where the ratio of the length to the width of the opening exceeds 1,000 times, the amount of injected fine particles is limited and the deposition rate is significantly reduced although the efficiency of charging particles is improved. The ratio of the length to the width of the nozzle opening is favorably not less than 20 times and not more than 800 times, more favorably, not less than 30 times and not more than 400 times.

The deposition apparatus 1 further includes a target 19 connected to a ground potential. The target 19 is arranged in the deposition chamber 3, and is configured to be capable of causing the raw material particles P to be charged by collision with the aerosol injected from the nozzle 18. Specifically, the deposition apparatus 1 according to this embodiment is configured to cause an aerosol of the raw material particles P injected from the nozzle 18 to collide with the target 19 to cause the raw material particles P to be charged, to generate nano-sized fine particles (nanoparticles) by discharge of the charged raw material particles P, and to deposit the generated nanoparticles on the substrate S.

The charging of the raw material particles P causes a gas component in the deposition chamber 3 to emit light, i.e., generates plasma, and sputters the surface of the raw material particles P in the plasma to generate nanoparticles. Many of the generated nanoparticles are electrically charged. The nanoparticles are attracted by the substrate S connected to a ground potential, and collide with the substrate S while being deposited on the substrate S with electrostatic adsorption with the surface of the substrate S (see an arrow A1 in FIG. 2). Accordingly, a dense film that includes fine particles and has a high adhesiveness is formed on the substrate.

On the other hand, electrically-neutral raw material particles having a relatively large particle diameter do not reach the substrate S and are ejected to the outside of the deposition chamber 3 through the gas stream (see an arrow A2 in FIG. 2). In order to efficiently form such a gas stream, an end portion 91 of the vacuum piping 9 connected to the deposition chamber 3 is favorably provided on a side wall on the opposite side of a side wall of the deposition chamber 3 to which the transfer tubing 6 is inserted.

The target 19 typically includes, but not limited to, a flat plate. The target 19 may include a bulk body having a block shape, a pillar shape, or a spherical shape. An irradiation surface 190 that is irradiated with an aerosol is not limited to a flat surface and may be a curved surface or a concavo-convex surface.

As the material constituting the target 19, a material that is likely to be negatively charged as compared with the raw material particles P is typically used. Specifically, in the case where the raw material particles P include alumina particles, a material that is on the negative side of the triboelectric series as compared with the alumina particles is favorable. Examples of such a material include stainless steel, copper, an alloy thereof, aluminum, an alloy thereof, a conductive material such as graphite, a semiconductor material such as silicon, and a mixture including at least two of them. In addition, the target 19 may include a laminated body obtained by bonding such a material to the surface of the above-mentioned bulk body.

The target 19 is arranged to be inclined with respect to the nozzle 18 by a predetermined angle so that the aerosol injected from the nozzle 18 enters the target 19 at a predetermined incidence angle (angle between the normal line direction of the irradiation surface 190 and the incident direction of the aerosol). The incidence angle is not less than 10 degrees and not more than 80 degrees, for example. In the case where the incidence angle is less than 10 degrees or exceeds 80 degrees, it is difficult to effectively cause the raw material particles P to be charged. By setting the incidence angle of the aerosol with respect to the target 19 to be in the above-mentioned range, it is possible to deposit the raw material particles. Moreover, in the case where the raw material particles include alumina particles, the incidence angle is set to be more than 30 degrees and less than 70 degrees, for example, and more favorably, not less than 45 degrees and not more than 65 degrees. Accordingly, it is possible to improve the efficiency of charging the raw material particles P, to effectively reduce the size of the raw material particles P to a nano-level size, and to form an alumina film having an excellent dielectric strength. The target 19 may be rotatably placed in the deposition chamber 3 so that the incidence angle can be varied.

The distance between the nozzle 18 and the target 19 is not particularly limited, and is not less than 5 mm and not more than 50 mm, for example. In the case where the distance is less than 5 mm, the influence of the interaction between particles positively charged on the target 19 and the nozzle 18 (outer surface of the tip portion is negatively quasi-charged) is large, and flying of the charged particles to the substrate is possibly inhibited. On the other hand, in the case where the distance exceeds 50 mm, the speed of the raw material particles injected from the nozzle 18 is attenuated, and effective collision of the particles with the target 19 and effective charging of the particles are possibly reduced. Moreover, because the range of the aerosol injected from the nozzle 18 is expanded, the target 19 needs to be increased in size in some cases. The target 19 may be movably placed in the direction in which the aerosol is injected in the deposition chamber 3 so that the distance can be varied.

The stage 7 (substrate S) is arranged on an axis line 191 that passes through the irradiation surface 190 of the target 19 and is in parallel with the irradiation surface 190. Specifically, the stage 7 is arranged at a position that is not on an extension of the direction in which the raw material particles injected from the nozzle 18 are regularly reflected on the irradiation surface 190 of the target 19. Accordingly, it is possible to prevent raw material particles that have a relatively large particle diameter and are pulverized by collision with the irradiation surface 190 and the material constituting the target 19 flies out of the irradiation surface 190 due to sputtering of the raw material particles P injected from the nozzle 18 from reaching the substrate S (see an arrow A3 in FIG. 2). As a result, it is possible to form a dense film that includes no raw material particle having a large particle diameter nor material constituting the target 19, but includes raw material particles having a fine particle diameter.

The irradiation surface 190 of the target 19 is arranged to be inclined with respect to the direction of the normal line of the surface of the stage 7 (substrate S) by a predetermined angle. In the case where the raw material particles include alumna particles, the predetermined angle is set to be more than 30 degrees and less than 70 degrees, and more favorably, not less than 45 degrees and not more than 65 degrees. The angle of the irradiation surface 190 with respect to the stage 7 (substrate S) may be set to the same angle as the incident angle of the aerosol with respect to the target 19 or an angle different from the incidence angle.

The distance between the stage 7 and the target 19 (distance between the collision point of the aerosol on the irradiation surface 190 and the surface of the stage 7 along the Z-axis direction) is not particularly limited, and is not less than 5 mm, for example. In the case where the distance is less than 5 mm, the target 19 is sputtered by ions in plasma generated on the surface of the substrate S and the material constituting the target 19 is possibly mixed in the film. The distance is favorably set to not less than 10 mm.

Deposition Method

Figure 2:
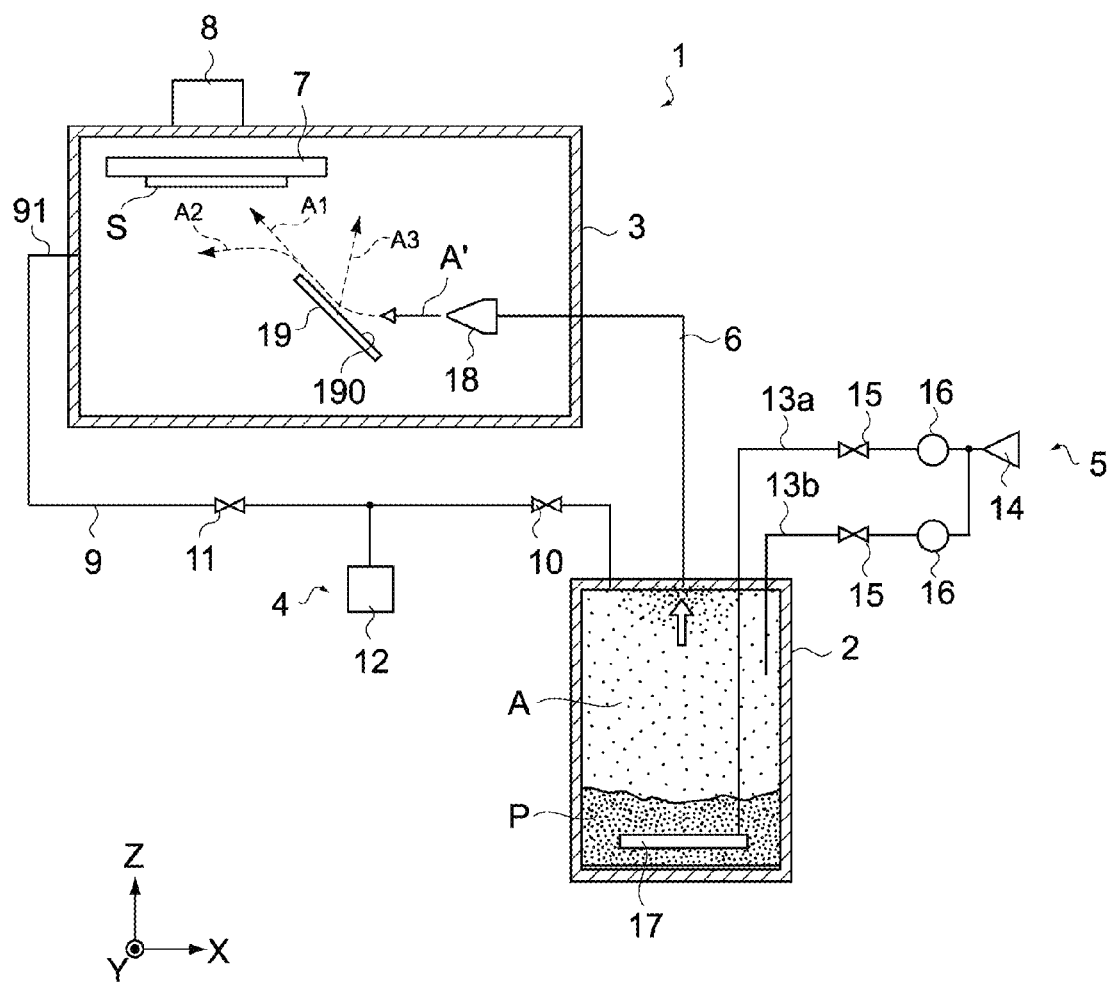
FIG. 2 is a schematic diagram for explaining the operation of the deposition apparatus.

Next, a deposition method according to this embodiment will be described with reference to FIG. 2. FIG. 2 is a schematic diagram for explaining the operation of the deposition apparatus 1. Hereinafter, a method of depositing an alumina film using the deposition apparatus 1 will be described.

A predetermined amount of raw material particles P (alumina powder) is placed in the generation chamber 2 first. A degassing/dehydrating process may be applied to the raw material particles P by heating in advance. Alternatively, by heating the generation chamber 2, the degassing/dehydrating process may be applied to the raw material particles P. By degassing/dehydrating the raw material particles P, it is possible to prevent the raw material particles P from agglomerating and to increase the amount of charged raw material particles P by facilitating drying.

Next, the evacuation system 4 evacuates the generation chamber 2 and the deposition chamber 3 to a predetermined reduced atmosphere. The operation of the vacuum pump 12 is started, and the first valve 10 and the second valve 11 are opened. When the pressure in the generation chamber 2 is sufficiently reduced, the first valve 10 is closed and the deposition chamber 3 is evacuated continuously. The generation chamber 2 is evacuated together with the deposition chamber 3 via the inside of the transfer tubing 6. Accordingly, the deposition chamber 3 is maintained at a pressure lower than that of the generation chamber 2.

Next, the gas supply system 5 introduces a carrier gas into the generation chamber 2. Each of the third valves 15 of the gas pipings 13a and 13b is opened, and the carrier gas is injected in the generation chamber 2 from the gas injection body 17. The carrier gas introduced into the generation chamber 2 increases the pressure in the generation chamber 2. Moreover, as shown in FIG. 2, the carrier gas injected from the gas injection body 17 causes the raw material particles P to fly, and the raw material particles P float in the generation chamber 2. Thus, an aerosol (represented by A in FIG. 2) including the raw material particles P dispersed in the carrier gas is formed. The generated aerosol A flows to the transfer tubing 6 due to the difference between pressures in the generation chamber 2 and the deposition chamber 3, and is injected from the nozzle 18. By adjusting the degree of opening of the third valve 15, the formation state of the aerosol A and the difference between pressures in the generation chamber 2 and the deposition chamber 3 are controlled.

The difference between pressures in the generation chamber 2 and the deposition chamber 3 is not particularly limited, and is not less than 10 kPa and not more than 180 kPa, for example. In the case where the differential pressure is less than 10 kPa, the deposition rate is low, which causes a trouble in practical use. On the other hand, in the case where the differential pressure is more than 100 kPa, the generation chamber 2 needs to have a pressure resistant structure with respect to an applied pressure. Specifically, because a glass container is not suitable as a pressurized container, it needs to use a stainless steel container having a pressure resistant structure, for example. The differential pressure may be further high. However, the differential pressure up to 180 kPa is favorable from a viewpoint of practical use, taking into account the regulation of a high pressure gas.

The aerosol (represented by A' in FIG. 2) that has flowed to the transfer tubing 6 is injected at a flow rate defined by the opening diameter of the nozzle 18 and the difference between pressures in the generation chamber 2 and the deposition chamber 3. The irradiation surface 190 of the target 19 is irradiated with the aerosol of the raw material particles P injected from the nozzle 18. The raw material particles P positively charged by collision or friction with the irradiation surface 190 discharge between the raw material particles P and the irradiation surface 190 or gas molecules in the vicinity of the irradiation surface 190, and plasma of the carrier gas is generated. The surface of the raw material particles P is sputtered by plasma, and thus, the raw material particles P are reduced in size. Accordingly, nano-sized fine particles having a size of not less than 5 nm and not more than 25 nm are generated, for example. Many of the generated fine particles are electrically charged, and are electrostatically attracted by the substrate S on the stage 7 connected to a ground potential toward the substrate S connected to a ground potential along the axis line 191 as shown in an arrow A1 in FIG. 2. The fine particles may grow or agglomerate until the fine particles reach the substrate S. When the fine particles reach the surface of the substrate S, the fine particles collide with the surface of the substrate S and are brought into close contact with the surface of the substrate S with electrostatic attraction with the substrate S. Accordingly, a dense fine particle film (alumina film) having an excellent adhesiveness is formed.

On the other hand, most of neutral raw material particles that are not charged are introduced into an exhaust vent of the deposition chamber 3 (the end portion 91 of the vacuum piping 9) through the gas stream represented by an arrow A2 in FIG. 2, and ejected to the outside of the deposition chamber 3 without reaching the substrate S. Therefore, it is possible to deposit only nano-sized fine particles on the substrate S without mixing coarse particles in the film.

Furthermore, raw material particles regularly reflected on the irradiation surface 190 of the target 19, the material constituting the irradiation surface 190 sputtered by the raw material particles, or the like flies through a path represented by an arrow A3 in FIG. 2, and is attached to the inner wall of the deposition chamber 3, for example, without reaching the substrate S. Therefore, it is possible to prevent coarse raw material particles, the material constituting the target 19, and the like from mixing in the coating film on the substrate S.

It should be noted that when the fine particles of the charged raw material particles P reach the substrate S, a discharge phenomenon with light emission is caused on the surface of the substrate S in some cases. Also in this case, the fine particles are further broken by sputtering in plasma, and the particles are deposited on the substrate. Accordingly, it is possible to further improve the density and adhesiveness of a film.

The stage 7 is reciprocated at a predetermined speed along the in-plane direction of the substrate S by the stage drive mechanism 8. Accordingly, it is possible to form a coating film in a desired area of the surface of the substrate S. In this embodiment, because the stage 7 is reciprocated in parallel with the X-axis direction, i.e., the gas flow direction, a thickness distribution in which the film thickness increases as the distance from the target 19 increases is achieved. Accordingly, an interference fringe of light caused due to the difference of the film thickness is observed in the deposition area after deposition in some cases.

Figure 3:
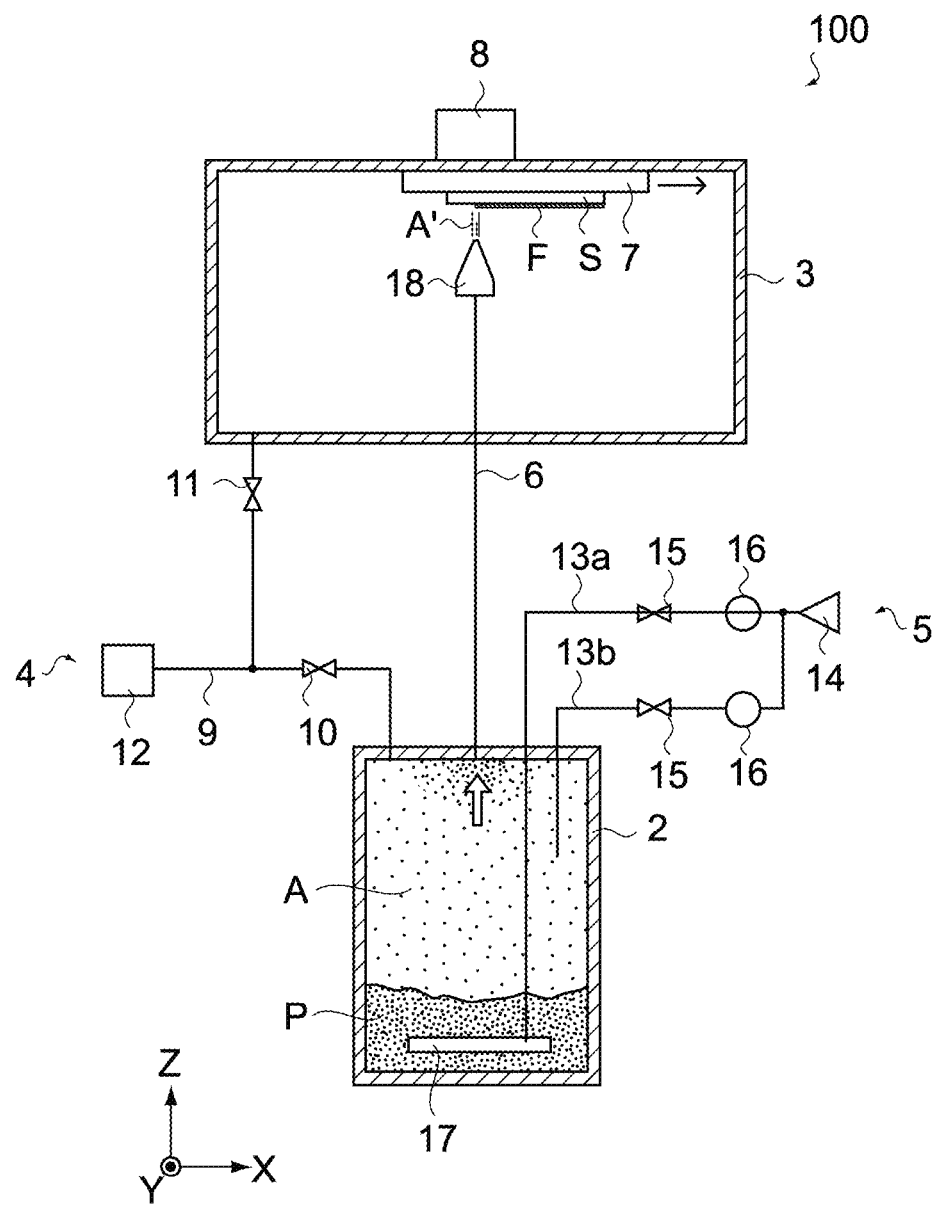
FIG. 3 is a schematic configuration diagram of a deposition apparatus according to a comparative example.

FIG. 3 is a schematic configuration diagram of a deposition apparatus 100 according to a comparative example. Hereinafter, the deposition method according to this embodiment will be described in comparison with the deposition method using the deposition apparatus 100.

It should be noted that in FIG. 3, the same components as those in FIG. 1 will be denoted by the same reference symbols and a description thereof will be omitted.

The deposition apparatus 100 shown in FIG. 3 is different from the deposition apparatus 1 according to this embodiment in that the deposition apparatus 100 does not include the target 19. Specifically, the deposition apparatus 100 according to the comparative example is configured so that the nozzle 18 is arranged at a position that faces the substrate S on the stage 7 and an aerosol A' injected from the nozzle 18 is directly applied to the surface of the substrate S.

Figure 4:
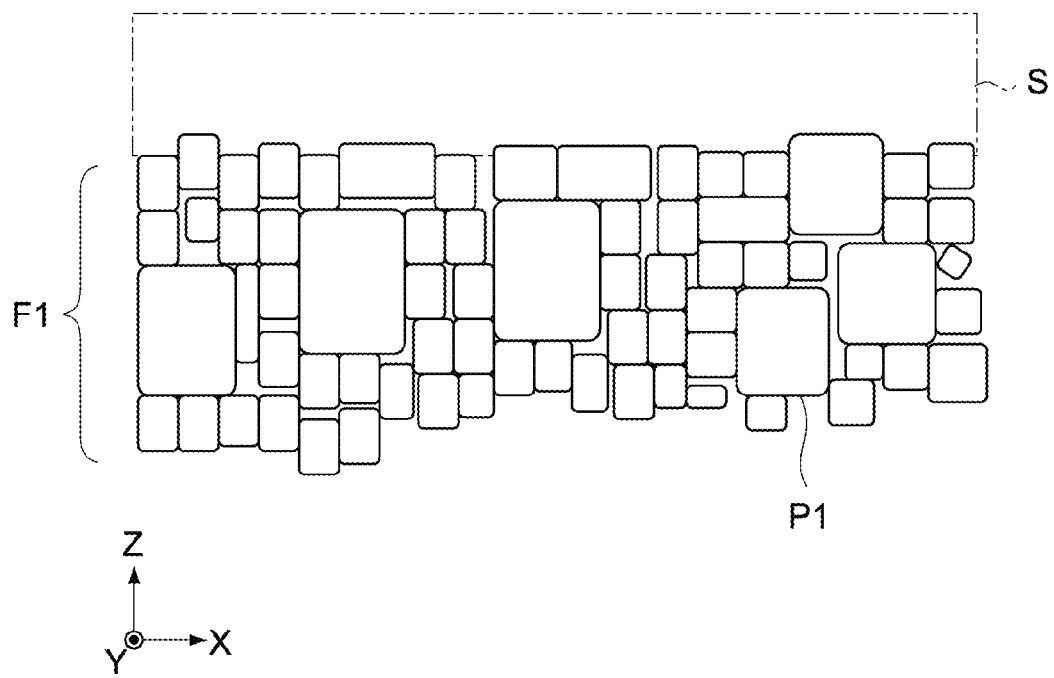
FIG. 4 is a schematic diagram showing the structure of a film formed by a deposition method according to a comparative example.

FIG. 4 is a schematic diagram showing the structure of a film deposited by the deposition apparatus 100 according to the comparative example.

A film F1 deposited by the deposition apparatus 100 according to the comparative example has a relatively high adhesive force to the substrate S. However, because various raw material particles P1 having different particle sizes are mixed in the film F1, many spaces are formed between the particles. This is considered because a method of directly spraying an aerosol to the substrate S to form a film is used and thus, fine powder generated by sputtering of raw material powder having an original particle size or raw material particles charged by friction with the inner surface of the nozzle due to discharge between the powder or particles and the substrate is deposited concurrently. Therefore, it is difficult to improve the density of a formed film. Furthermore, it may be impossible to ensure a stable film quality because the density of the film varies.

Figure 5:
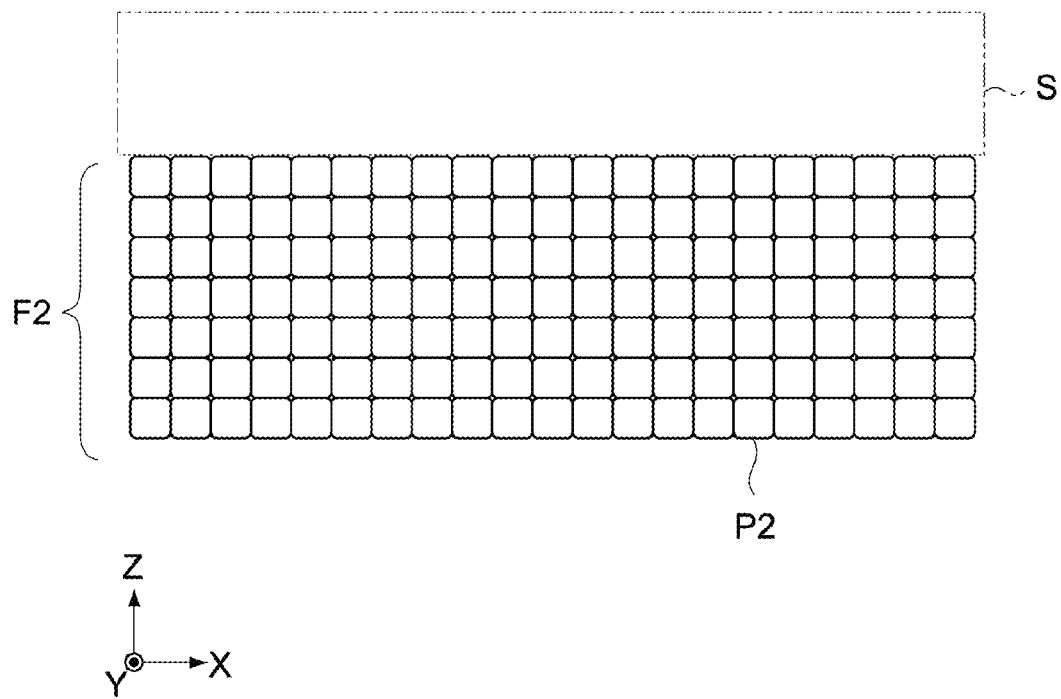
FIG. 5 is a schematic diagram showing the structure of a film formed by a deposition method according to an embodiment of the present disclosure.

On the other hand, the deposition method using the deposition apparatus 1 according to this embodiment applies an aerosol to the target 19 once. Therefore, it is possible to improve the efficiency of charging the raw material particles P. Accordingly, the amount proportion of charged fine raw material particles to the raw material particles that have reached the substrate increases, and it is possible to deposit uniform nano-sized particles P2 (having a particle diameter of not less than 5 nm and not more than 15 nm, for example) on the substrate S as shown in FIG. 5. In this way, it is possible to form a dense film F2 with a few spaces between the particles while ensuring the adhesiveness to the substrate S.

Moreover, according to this embodiment, the dispersibility of each particle increases because nanoparticles generated by the sputtering phenomenon in the vicinity of the surface of the target 19 and the substrate S are deposited on the substrate S. Accordingly, it is possible to form a film having a uniform particle size distribution on the substrate S.

In order to improve the deposition rate, it is favorable to improve the efficiency of charging the raw material particles or use a type of gas having a low discharge voltage as a carrier gas. This is because the efficiency of generating ions increases as the discharge voltage is reduced, thereby improving the efficiency of sputtering the raw material particles and facilitating generation of the fine particles. Typical examples of the gas having a low discharge voltage include argon. By using argon, it is possible to reduce the discharge voltage as compared with a gas such as nitrogen.

Moreover, in the case where the raw material particles include an oxide, oxygen defect tends to be caused due to the sputtering of ions in plasma. In this case, the insulating properties of a formed film are reduced, and it is difficult to reliably form an oxide thin film having a desired dielectric strength. By mixing an oxidized gas such as oxygen (e.g., 5% or more) in the carrier gas or using the oxidized gas as the carrier gas, it is possible to reduce oxygen defect caused due to the sputtering operation of plasma. Accordingly, it is possible to ensure the oxygen concentration in the film and to form a thin film having an excellent dielectric strength, for example.

On the other hand, the pressure of the carrier gas affects generation of plasma, i.e., generation of discharge. If there is no gas component (high vacuum), plasma in the state where a plus ion and an electron coexist is not maintained. In this regard, in this embodiment, the flow rate of the carrier gas is set so that the pressure of the deposition chamber 3 is not less than 50 Pa and not more than 3 kPa, for example. Accordingly, it is possible to reliably generate and maintain plasma, and to reliably deposit a film having a uniform particle size.

Furthermore, the raw material particles P1 may be heated at a temperature of not less than 300° C. under vacuum in the generation chamber 2 before an aerosol is generated. Accordingly, it is possible to facilitate desorbing of adsorbing water or bonding water of the raw material particles P1 and of carbonic acid adsorption to optimize the concentration and friction charge amount of the transferred raw material particles P1 by gas. Moreover, because the raw material particles P1 is heated under vacuum in a container for generating an aerosol, it is possible to generate an aerosol without exposing the raw material particles P1 to the atmosphere after the desorbing process.

Formed Film

It is an important development item in designing of a laminated device to increase the insulating properties of a coating film in order to put a thin film electronic device into practical use. It is desired to form a thin coating film having a high dielectric breakdown electric field intensity. For example, alumina is a material having insulating properties and a low-dielectric constant (low-k), and the dielectric breakdown electric field intensity of the bulk of alumina is 100 to 160 kV/cm. In order to produce a fine thin film device, for example, an alumina insulating film needs to have a thickness of not more than 10 μm and a resistance voltage of not less than 3 kV. The dielectric breakdown electric field intensity corresponds to not less than 3 MV/cm being about 20 times as large as that of the bulk body.

It is considered that in the structure where fine ceramic nanoparticles are densely bonded, the insulation resistance is theoretically higher than that of the bulk body due to increase in the number of bonding interfaces. In order to achieve a dielectric breakdown electric field intensity higher than that of the bulk body, there is a need to form a coating film in which nanoparticles having a remained structure are densely coupled. Moreover, it is necessary to reduce the temperature in the deposition process to cause the nanoparticles to remain.

The deposition method according to this embodiment generates plasma by applying an aerosol of raw material particles, as described above, and achieves charging of raw material particles and size reduction of nanoparticles by sputtering with discharge. Accordingly, as shown in FIG. 5, it is possible to obtain the coating film F2 being an aggregation film of the nano-sized crystalline particles P2. It goes without saying that in the film, particles finer than the crystalline particles P2 or particles that are slightly larger than the crystalline particles P2 may be mixed. It has been confirmed that in the case where a film is formed with alumina raw material particles having an average particle diameter of 0.5 μm, the average particle diameter of the crystalline particles P2 is not less than 5 nm and not more than 25 nm.

Therefore, the density of the film formed on the substrate S is equivalent to that obtained not only by the deposition method according to the comparative example but also by another thin film formation method such as a CVD method and a sputtering method. According to this embodiment, it is possible to form an alumina film having a dielectric breakdown electric field intensity that is not less than 10 times as large as that of the bulk body. In particular, a formed alumina thin film is confirmed to have a film thickness of 0.5 μm and a dielectric breakdown electric field intensity of not less than 3 MV/cm. This value corresponds to 20 times of that of the bulk body. Furthermore, the deposition rate is 20 times as high as that in the sputtering method. Furthermore, according to this embodiment, it is possible to reliably deposit a highly-resistive insulating film having a direct current electrical resistance of not less than $1 \times 10^{11} \Omega$ and not more than $1 \times 10^{12} \Omega$.

Figure 6:
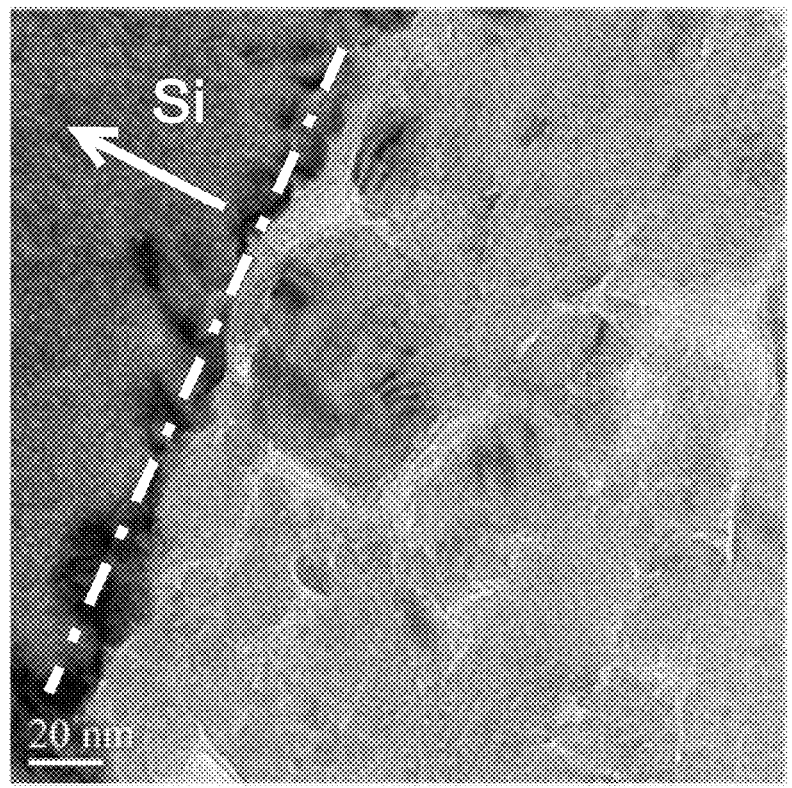
FIG. 6 is a TEM image showing the boundary area between a substrate and an alumina fine particle film deposited by using the deposition apparatus.

Moreover, in the deposition method according to this embodiment, electrostatic adsorption operation on the surface of the substrate S (or a fine particle film formed on the surface) rather than mechanical adhesion operation obtained by collision of the raw material fine particles with the surface of the substrate S dominates on the coating film F2 formed on the surface of the substrate S. The surface of the substrate S is a uniform surface before and after the deposition. Therefore, it is possible to prepare a structure in which the coating film F2 having an excellent adhesiveness is formed on the surface of the substrate S without forming an anchor portion deformed in a concavo-convex shape by collision with the raw material fine particles. FIG. 6 is a TEM image showing the boundary area between a silicon substrate and an alumina fine particle film formed thereon.

Moreover, the alumina thin film formed by the deposition method according to this embodiment has a high transparency, and can be applied to a heat insulation coating film including a glass material in the architectural industry or automobile industry, for example, with a synergetic effect of high toughness and high heat insulating properties of alumina. Moreover, in the electronics industry, information and communication industry, aerospace industry, and the like, a thin alumina insulation film having a high intensity and a high dielectric breakdown voltage can be applied to the outside coating in order to further downscale a chip component. Furthermore, a zirconia thin film deposited by this method can be applied to an electrode film and a partition wall formation film between electrodes in a solid battery in a battery industry field.

EXAMPLES

Hereinafter, typical examples of the present disclosure will be described. It goes without saying that the present disclosure is not limited to these examples.

Example 1

SUS Substrate

Forty g of alumina powder (manufactured by SHOWA DENKO K.K.: AL-160SG-3) having an average particle diameter of 0.5 μm was put in an alumina tray, and a heat treatment was performed for 1 hour at a temperature of 300° C. in the atmosphere. After that, the 40 g of alumina powder was immediately transferred to an aerosol-generating container formed of glass, and the aerosol-generating container was vacuum-evacuated to not more than 1 Pa. In order to facilitate removal of water in the powder, the aerosol-generating container was heated at a temperature of 150° C. by a mantle heater, and was vacuum-evacuated.

The evacuation valve of the aerosol-generating container was closed, and a nitrogen gas for flying and transfer was adjusted by a flowmeter and was supplied in the amount of 8 L/min and 5 L/min. The alumina powder in the aerosol-generating container (pressure; about 23 kPa) was aerosolized, transferred by gas, and applied to a target (stainless steel; size of 60 mm square, thickness of 0.5 mm) through a transfer tubing and a nozzle (having an opening of 30 mm×0.3 mm). The incidence angle from the nozzle to the target was 60 degrees (angle inclined with respect to the target from a vertical line by 60 degrees; the same shall apply hereinafter). The distance (space) between the tip of the nozzle and the target was 8 mm.

The powder applied to the target was deposited on a stainless steel substrate (having a size of 60 mm square and a thickness of 1 mm) attached to an opposed stage that is 28 mm away from the target (pressure in the deposition chamber; about 170 Pa). The target surface was caused to have an angle of 60 degrees with respect to the substrate (angle inclined with respect to the substrate from a vertical line by 60 degrees; the same shall apply hereinafter). The drive rate of the substrate was 5 mm/s, and 250 films were laminated at the length of 20 mm (deposition time was about 16 minutes). A transparent alumina film having a film thickness of 4 μm at the center portion, a width of about 37 mm, and a length of about 28 mm, was formed. The deposition shape was a trapezoidal shape having a peripheral portion on which an interference fringe could be seen. The film quality was dense, and the film has a strong adhesive force (which is not removed even if it is scratched by an HB pencil) to a stainless steel substrate.

The direct current electrical resistance of the formed alumina film was measured. As a result, the alumina film showed an electrical resistance of $5\times10^{11}\Omega$. The film thickness and volume resistivity of the alumina film were not less than 4 μm and $1.2\times10^{15}$ Ωcm, respectively. This volume resistivity exceeded that of an alumina ceramic (bulk body; not less than $10^{14}$ Ωcm and not more than $10^{15}$ Ωcm).

Example 2

Si Substrate

Fifty g of alumina powder (manufactured by SHOWA DENKO K.K.: AL-160SG-3) having an average particle diameter of 0.5 μm was put in an alumina tray, and a heat treatment was performed for 1 hour at a temperature of 300° C. in the atmosphere. After that, the 50 g of alumina powder was immediately transferred to an aerosol-generating container formed of glass, and the aerosol-generating container was vacuum-evacuated to not more than 2 Pa. In order to facilitate removal of water in the powder, the aerosol-generating container was heated at a temperature of 150° C. by a mantle heater, and was vacuum-evacuated.

The evacuation valve of the aerosol-generating container was closed, and a nitrogen gas for flying and transfer was adjusted by a flowmeter and was supplied in the amount of 8 L/min and 10 L/min. The alumina powder in the aerosol-generating container (pressure; about 33 kPa) was aerosolized, transferred by gas, and applied to a target (stainless steel; size of 60 mm square, thickness of 0.5 mm) through a transfer tubing and a nozzle (having an opening of 30 mm×0.3 mm). The incidence angle from the nozzle to the target was 60 degrees. The distance (space) between the tip of the nozzle and the target was 8 mm.

The powder applied to the target was deposited on a Si substrate (having a size of half of a 2-inch wafer and a thickness of 0.5 mm) attached to an opposed stage that is 28 mm away from the target (pressure in the deposition chamber; about 250 Pa). The target surface was caused to have an angle of 60 degrees with respect to the substrate. The drive rate of the substrate was 5 mm/s, and 25 films were laminated at the length of 30 mm (deposition time was about 2.5 minutes). A transparent alumina film having a film thickness of 0.7 μm at the center portion, a width of about 30 mm, and a length of about 30 mm, was formed. The deposition shape was a trapezoidal shape having a peripheral portion on which an interference fringe could be seen.

The film quality was dense, and the film has a strong adhesive force (which is not removed even if it is scratched by an HB pencil) to a Si substrate.

The dielectric breakdown electric field intensity of the formed alumina film was measured. As a result, no insulation breakdown was caused at the center portion (having a thickness of 0.7 μm) even when a voltage of 200 V was applied thereto. It was found that insulation breakdown was caused at the peripheral portion (having a film thickness of 0.55 μm) when a voltage of 150 V was applied thereto. The dielectric breakdown electric field intensity of the alumina film was calculated by the following formula: $200 \text{ V}/7\times10^{-5}$ cm=2.7 MV/cm. This corresponds to not less than 10 times of that of an alumina ceramic (bulk body; 100 kV/cm to 160 kV/cm).

Example 3

Cu Substrate

Forty g of alumina powder (manufactured by SHOWA DENKO K.K.: AL-160SG-3) having an average particle diameter of 0.5 μm was put in an alumina tray, and a heat treatment was performed for 1 hour at a temperature of 300° C. in the atmosphere. After that, the 40 g of alumina powder was immediately transferred to an aerosol-generating container formed of glass, and the aerosol-generating container was vacuum-evacuated to not more than 1 Pa. In order to facilitate removal of water in the powder, the aerosol-generating container was heated at a temperature of 150° C. by a mantle heater, and was vacuum-evacuated.

The evacuation valve of the aerosol-generating container was closed, and a nitrogen gas for flying and transfer was adjusted by a flowmeter and was supplied in the amount of 8 L/min and 5 L/min. The alumina powder in the aerosol-generating container (pressure; about 22 kPa) was aerosolized, transferred by gas, and applied to a target (stainless steel; size of 60 mm square, thickness of 0.5 mm) through a transfer tubing and a nozzle (having an opening of 30 mm×0.3 mm). The incidence angle from the nozzle to the target was 60 degrees. The distance (space) between the tip of the nozzle and the target was 8 mm.

The powder applied to the target was deposited on a copper substrate (having a size of 60 mm square and a thickness of 1 mm) attached to an opposed stage that is 28 mm away from the target (pressure in the deposition chamber; about 160 Pa). The target surface was caused to have an angle of 60 degrees with respect to the substrate. The drive rate of the substrate was 5 mm/s, and 250 films were laminated at the length of 20 mm (deposition time was about 16 minutes). A transparent alumina film having a film thickness of 4 μm at the center portion, a width of about 37 mm, and a length of about 28 mm, was formed. The deposition shape was a trapezoidal shape having a peripheral portion on which an interference fringe could be seen.

The film quality was dense, and the film has a strong adhesive force (which is not removed even if it is scratched by an HB pencil) to a copper substrate. The direct current electrical resistance of the formed alumina film was measured. As a result, the alumina film showed an electrical resistance of $3 \times 10^{11} \Omega$.

Example 4

Glass Slide Substrate

Forty g of alumina powder (manufactured by SHOWA DENKO K.K.: AL-160SG-3) having an average particle diameter of 0.5 μm was put in an alumina tray, and a heat treatment was performed for 1 hour at a temperature of 300° C. in the atmosphere. After that, the 40 g of alumina powder was immediately transferred to an aerosol-generating container formed of glass, and the aerosol-generating container was vacuum-evacuated to not more than 1 Pa. In order to facilitate removal of water in the powder, the aerosol-generating container was heated at a temperature of 150° C. by a mantle heater, and was vacuum-evacuated.

The evacuation valve of the aerosol-generating container was closed, and a nitrogen gas for flying and transfer was adjusted by a flowmeter and was supplied in the amount of 8 L/min and 5 L/min. The alumina powder in the aerosol-generating container (pressure; about 22 kPa) was aerosolized, transferred by gas, and applied to a target (stainless steel; size of 60 mm square, thickness of 0.5 mm) through a transfer tubing and a nozzle (having an opening of 30 mm×0.3 mm). The incidence angle from the nozzle to the target was 60 degrees. The distance (space) between the tip of the nozzle and the target was 8 mm.

The powder applied to the target was deposited on a glass slide substrate (having a size of 50 mm×70 mm and a thickness of 1 mm) attached to an opposed stage that is 28 mm away from the target (pressure in the deposition chamber; about 160 Pa). The target surface was caused to have an angle of 60 degrees with respect to the substrate. The drive rate of the substrate was 5 mm/s, and 250 films were laminated at the length of 20 mm (deposition time was about 16 minutes). A transparent alumina film having a film thickness of 2 μm at the center portion, a width of about 37 mm, and a length of about 28 mm, was formed. The deposition shape was a trapezoidal shape having a peripheral portion on which an interference fringe could be seen.

The film quality was dense, and the film has a strong adhesive force (which is not removed even if it is scratched by an HB pencil) to a glass slide substrate.

Example 5

SUS Block Substrate

Fifty g of alumina powder (manufactured by SHOWA DENKO K.K.: AL-160SG-3) having an average particle diameter of 0.5 μm was put in an alumina tray, and a heat treatment was performed for 1 hour at a temperature of 300° C. in the atmosphere. After that, the 50 g of alumina powder was immediately transferred to an aerosol-generating container formed of glass, and the aerosol-generating container was vacuum-evacuated to not more than 1 Pa. In order to facilitate removal of water in the powder, the aerosol-generating container was heated at a temperature of 150° C. by a mantle heater, and was vacuum-evacuated.

The evacuation valve of the aerosol-generating container was closed, and a nitrogen gas for flying and transfer was adjusted by a flowmeter and was supplied in the amount of 8 L/min and 10 L/min. The alumina powder in the aerosol-generating container (pressure; about 28 kPa) was aerosolized, transferred by gas, and applied to a target (stainless steel; size of 60 mm square, thickness of 0.5 mm) through a transfer tubing and a nozzle (having an opening of 30 mm×0.3 mm). The incidence angle from the nozzle to the target was 60 degrees. The distance (space) between the tip of the nozzle and the target was 8 mm.

The powder applied to the target was deposited on a stainless steel substrate (having a size of 30 mm square and a thickness of 10 mm) attached to an opposed stage that is 15 mm away from the target (pressure in the deposition chamber; about 230 Pa). The target surface was caused to have an angle of 60 degrees with respect to the substrate. The drive rate of the substrate was 1 mm/s, and 50 films were laminated at the length of 30 mm (deposition time was about 25 minutes).

After that, the aerosol-generating container was returned to the atmosphere once, and 50 g of the same alumina powder obtained by performing a heat treatment for 1 hour at a temperature of 300° C. in the atmosphere was additionally put in the aerosol-generating container. The aerosol-generating container was heated again at a temperature of 150° C. and vacuum-evacuated to 1 Pa.

The evacuation valve of the aerosol-generating container was closed, and a nitrogen gas for flying and transfer was adjusted by a flowmeter and was supplied in the amount of 8 L/min and 10 L/min. The alumina powder in the aerosol-generating container (pressure; about 28 kPa) was aerosolized, transferred by gas, and applied to a new target (stainless steel; size of 60 mm square, thickness of 0.5 mm) through a transfer tubing and a nozzle (having an opening of 30 mm×0.3 mm). The incidence angle from the nozzle to the target was 60 degrees. The distance (space) between the tip of the nozzle and the target was 8 mm.

The powder applied to the target was deposited on a stainless steel substrate (having a size of 30 mm square and a thickness of 10 mm) attached to an opposed stage that is 15 mm away from the target (pressure in the deposition chamber; about 230 Pa). The target surface was caused to have an angle of 60 degrees with respect to the substrate. The drive rate of the substrate was 1 mm/s, and 50 films were laminated at the length of 30 mm (deposition time was about 25 minutes; total deposition time was about 50 minutes).

An alumina film having a film thickness of 11 µm at the center portion was formed on the entire surface of the substrate having a size of 30 mm×30 mm. The film quality was dense, and the film has a strong adhesive force (which is not removed even if it is scratched by an HB pencil) to a stainless steel substrate. The direct current electrical resistance of the formed alumina film was measured. As a result, the alumina film showed an electrical resistance of $1\times10^{12}\Omega$.

Example 6

AlN, Cu Substrate

Thirty g of aluminum nitride powder (manufactured by Tokuyama Corporation) having an average particle diameter of 1 µm was put in an alumina tray, and a heat treatment was performed for 5 hour at a temperature of 800° C. in the atmosphere. After that, the 30 g of aluminum nitride powder was immediately transferred to an aerosol-generating container formed of glass, and the aerosol-generating container was vacuum-evacuated to not more than 1 Pa. In order to facilitate removal of water in the powder, the aerosol-generating container was heated at a temperature of 150° C. by a mantle heater, and was vacuum-evacuated.

The evacuation valve of the aerosol-generating container was closed, and a nitrogen gas for flying and transfer was adjusted by a flowmeter and was supplied in the amount of 5 L/min and 15 L/min. The aluminum nitride powder in the aerosol-generating container (pressure; about 30 kPa) was aerosolized, transferred by gas, and applied to a target (stainless steel; size of 60 mm square, thickness of 0.5 mm) through a transfer tubing and a nozzle (having an opening of 30 mm×0.3 mm). The incidence angle from the nozzle to the target was 60 degrees. The distance (space) between the tip of the nozzle and the target was 8 mm.

The powder applied to the target was deposited on a copper substrate (having a size of 60 mm square and a thickness of 1 mm) attached to an opposed stage that is 28 mm away from the target (pressure in the deposition chamber; about 250 Pa). The target surface was caused to have an angle of 60 degrees with respect to the substrate. The drive rate of the substrate was 1 mm/s, and 55 films were laminated at the length of 30 mm (deposition time was about 28 minutes). A brown-black aluminum nitride film having a film thickness of 2 µm at the center portion was formed. The film quality was dense, and the film has a strong adhesive force (which is not removed even if it is scratched by an HB pencil) to a copper substrate.

Example 7

Circular Nozzle

Forty g of alumina powder (manufactured by SHOWA DENKO K.K.: AL-160SG-3) having an average particle diameter of 0.5 µm was put in an alumina tray, and a heat treatment was performed for 1 hour at a temperature of 300° C. in the atmosphere. After that, the 40 g of alumina powder was immediately transferred to an aerosol-generating container formed of glass, and the aerosol-generating container was vacuum-evacuated to not more than 1 Pa. In order to facilitate removal of water in the powder, the aerosol-generating container was heated at a temperature of 150° C. by a mantle heater, and was vacuum-evacuated.

The evacuation valve of the aerosol-generating container was closed, and a nitrogen gas for flying and transfer was adjusted by a flowmeter and was supplied in the amount of 8 L/min and 12 L/min. The alumina powder in the aerosol-generating container (pressure; about 52 kPa) was aerosolized, transferred by gas, and applied to a target (stainless steel; size of 60 mm square, thickness of 0.5 mm) through a transfer tubing and a nozzle (circular nozzle having an opening of φ1.6 mm). The incidence angle from the nozzle to the target was 65 degrees. The distance (space) between the tip of the nozzle and the target was 8 mm.

The powder applied to the target was deposited on a copper substrate (having a size of 50 mm×70 mm and a thickness of 1 mm) attached to an opposed stage that is 28 mm away from the target (pressure in the deposition chamber; about 240 Pa). The target surface was caused to have an angle of 65 degrees with respect to the substrate. The drive rate of the substrate was 2 mm/s. A process including 2 times of deposition at the length of 30 mm in the X-axis direction and 1 time of deposition at the length of 5 mm in the Y-axis direction was performed 6 times. This repetitive deposition was performed further 3 times (deposition time was about 11 minutes). A transparent alumina film having a film thickness of 3 µm at the center portion, a width of about 35 mm, and a length of about 38 mm, was formed.

The film quality was dense, and the film has a strong adhesive force (which is not removed even if it is scratched by an HB pencil) to a copper substrate. The direct current electrical resistance of the formed alumina film was measured. As a result, the alumina film showed an electrical resistance of $2\times10^{11}\Omega$.

Example 8

Cu Target

Thirty g of alumina powder (manufactured by SHOWA DENKO K.K.: AL-160SG-3) having an average particle diameter of 0.5 µm was put in an alumina tray, and a heat treatment was performed for 1 hour at a temperature of 300° C. in the atmosphere. After that, the 30 g of alumina powder was immediately transferred to an aerosol-generating container formed of glass, and the aerosol-generating container was vacuum-evacuated to not more than 1 Pa. In order to facilitate removal of water in the powder, the aerosol-generating container was heated at a temperature of 150° C. by a mantle heater, and was vacuum-evacuated.

The evacuation valve of the aerosol-generating container was closed, and a nitrogen gas for flying and transfer was adjusted by a flowmeter and was supplied in the amount of 8 L/min and 5 L/min. The alumina powder in the aerosol-generating container (pressure; about 22 kPa) was aerosolized, transferred by gas, and applied to a target (copper; size of 60 mm square, thickness of 0.5 mm) through a transfer tubing and a nozzle (having an opening of 30 mm×0.3 mm). The incidence angle from the nozzle to the target was 60 degrees. The distance (space) between the tip of the nozzle and the target was 10 mm.

The powder applied to the target was deposited on a copper substrate (having a size of 50 mm×70 mm and a thickness of 1 mm) attached to an opposed stage that is 28 mm away from the target (pressure in the deposition chamber; about 160 Pa). The target surface was caused to have an angle of 60 degrees with respect to the substrate. The drive rate of the substrate was 5 mm/s, and 250 films were laminated at the length of 20 mm (deposition time was about 16 minutes). A transparent alumina film having a film thickness of 4 µm at the center portion, a width of about 37 mm, and a length of about 28 mm, was formed. The deposition shape was a trapezoidal shape having a peripheral portion on which an interference fringe could be seen.

The film quality was dense, and the film has a strong adhesive force (which is not removed even if it is scratched by an HB pencil) to a copper substrate. The direct current electrical resistance of the formed alumina film was measured. As a result, the alumina film showed an electrical resistance of $3\times10^{11}\Omega$ Example 9

Alumina Target

Sixty g of alumina powder (manufactured by SHOWA DENKO K.K.: AL-160SG-3) having an average particle diameter of 0.5 μm was put in an alumina tray, and a heat treatment was performed for 1 hour at a temperature of 300° C. in the atmosphere. After that, the 60 g of alumina powder was immediately transferred to an aerosol-generating container formed of glass, and the aerosol-generating container was vacuum-evacuated to not more than 1 Pa. In order to facilitate removal of water in the powder, the aerosol-generating container was heated at a temperature of 150° C. by a mantle heater, and was vacuum-evacuated.

The evacuation valve of the aerosol-generating container was closed, and a nitrogen gas for flying and transfer was adjusted by a flowmeter and was supplied in the amount of 8 L/min and 5 L/min. The alumina powder in the aerosol-generating container (pressure; about 22 kPa) was aerosolized, transferred by gas, and applied to a target (alumina; size of 60 mm square, thickness of 0.5 mm) through a transfer tubing and a nozzle (having an opening of 30 mm×0.3 mm). The incidence angle from the nozzle to the target was 60 degrees. The distance (space) between the tip of the nozzle and the target was 10 mm.

The powder applied to the target was deposited on a stainless steel substrate (having a size of 50 mm×70 mm and a thickness of 1 mm) attached to an opposed stage that is 35 mm away from the target (pressure in the deposition chamber; about 160 Pa). The target surface was caused to have an angle of 65 degrees with respect to the substrate. The drive rate of the substrate was 1 mm/s. A process including deposition at the length of 5 mm in the X-axis direction and at the length of 10 mm in the Y-axis direction was performed 200 times (deposition time was about 24 minutes). A transparent alumina film having a film thickness of 2 μm at the center portion, a width of about 40 mm, and a length of about 25 mm, was formed.

The deposition rate was increased to 1/8 of that in the Example 1 using a stainless steel as a target. However, the film quality was dense, and the film has a strong adhesive force (which is not removed even if it is scratched by an HB pencil) to a copper substrate. The direct current electrical resistance of the formed alumina film was measured. As a result, the alumina film showed an electrical resistance of $1\times10^{11}\Omega$.

Comparative Example 1

Ninety g of alumina powder (manufactured by SHOWA DENKO K.K.: AL-160SG-3) having an average particle diameter of 0.5 μm was put in an alumina tray, and a heat treatment was performed for 1 hour at a temperature of 300° C. in the atmosphere. After that, the 90 g of alumina powder was immediately transferred to an aerosol-generating container formed of glass, and the aerosol-generating container was vacuum-evacuated to not more than 1 Pa. In order to facilitate removal of water in the powder, the aerosol-generating container was heated at a temperature of 150° C. by a mantle heater, and was vacuum-evacuated.

The evacuation valve of the aerosol-generating container was closed, and a nitrogen gas for flying and transfer was adjusted by a flowmeter and was supplied in the amount of 20 L/min and 20 L/min. The alumina powder in the aerosol-generating container (pressure; about 94 kPa) was aerosolized, transferred by gas, and was deposited on a stainless steel substrate (having a size of 60 mm square and a thickness of 0.5 mm) through a transfer tubing and a nozzle (having an opening of 30 mm×0.3 mm) (pressure in the deposition chamber; about 450 Pa). The incidence angle from the nozzle to the substrate was 60 degrees. The distance between the tip of the nozzle and the substrate was 19 mm. The drive rate of the substrate was 1 mm/s, and 80 films were laminated at the length of 40 mm (deposition time was about 54 minutes). A white transparent alumina film having a film thickness of 27 μm at the center portion, a width of about 30 mm, and a length of about 40 mm, was formed.

The deposition rate was 0.5 μm/min. The film quality was dense, and the film has a strong adhesive force (which is not removed even if it is scratched by an HB pencil) to a stainless steel substrate.

The direct current electrical resistance of the formed alumina film was measured. As a result, the direct current electrical resistance of the alumina film significantly varies depending on the position of the film, and the alumina film showed electrical resistances of $10^3\Omega$ to $10^{10}\Omega$ The film was not suitable as an insulating film.

Comparative Example 2

Ninety g of alumina powder (manufactured by SHOWA DENKO K.K.: AL-160SG-3) having an average particle diameter of 0.5 μm was put in an alumina tray, and a heat treatment was performed for 1 hour at a temperature of 300° C. in the atmosphere. After that, the 90 g of alumina powder was immediately transferred to an aerosol-generating container formed of glass, and the aerosol-generating container was vacuum-evacuated to not more than 1 Pa. In order to facilitate removal of water in the powder, the aerosol-generating container was heated at a temperature of 150° C. by a mantle heater, and was vacuum-evacuated.

The evacuation valve of the aerosol-generating container was closed, and a nitrogen gas for flying and transfer was adjusted by a flowmeter and was supplied in the amount of 16 L/min and 16 L/min. The alumina powder in the aerosol-generating container (pressure; about 76 kPa) was aerosolized, transferred by gas, and was deposited on a stainless steel substrate (having a size of 60 mm square and a thickness of 0.5 mm) through a transfer tubing and a nozzle (having an opening of 30 mm×0.3 mm) (pressure in deposition chamber; about 370 Pa). The incidence angle from the nozzle to the substrate was 60 degrees. The distance (space) between the tip of the nozzle and the substrate was 19 mm. The drive rate of the substrate was 1 mm/s, and 40 films were laminated at the length of 40 mm (deposition time was about 27 minutes). A white transparent alumina film having a film thickness of 21 μm at the center portion, a width of about 30 mm, and a length of about 40 mm, was formed.

The deposition rate was 0.8 μm/min. The film quality was dense, and the film has a strong adhesive force (which is not removed even if it is scratched by an HB pencil) to a stainless steel substrate.

The direct current electrical resistance of the formed alumina film was measured. As a result, the direct current electrical resistance of the alumina film significantly varies depending on the position of the film, and the alumina film showed electrical resistances of $10^3 \Omega$ to $10^8 \Omega$. The film was not suitable as an insulating film.

Experimental Example

Next, an experimental example of this embodiment will be described.

Figure 7:
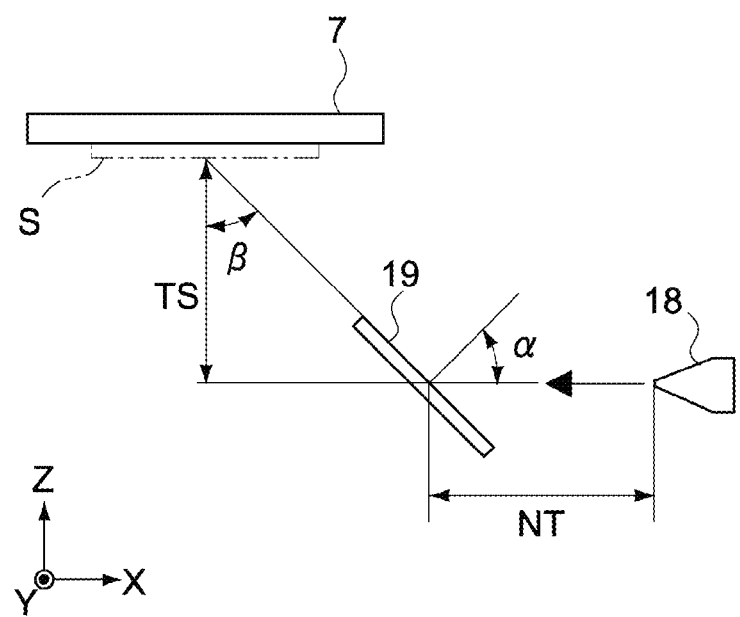
FIG. 7 is a schematic diagram of an apparatus for explaining an experimental example of the embodiment.

In this experimental example, as shown in FIG. 7, a plurality of samples of the alumina film were prepared with different incidence angles of the aerosol injected from the nozzle 18 to the target 19 (hereinafter, referred to as angle α) and different angles of the target irradiation surface to the substrate S on the stage 7 (hereinafter, referred to as angle β), and the film thickness and insulating properties of each sample were evaluated. The experimental results were shown in Table 1.

It should be noted that in this experiment, the direction in which the aerosol was injected from the nozzle 18 was set to be in parallel with the X-axis direction and the surface of the stage 7 (substrate S) was set to be in parallel with the XY-plane. The angle a was set to the angle between the direction of the normal line of the surface of the target 19 and the X-axis direction, and the angle β was set to the angle between the direction of the normal line of the surface of the stage 7 (substrate S) (Z-axis direction) and the surface of the target 19. The distance (NT) between the nozzle 18 and the surface of the target 19 was 13 mm, and the vertical distance (TS) between the surface of the substrate S and the surface of the target 19 along the Z-axis direction was 32 mm. As the target 19, the substrate S, the raw material powder, and the carrier gas, a stainless steel (SUS304) plate having a size of 20 mm×7 mm, a silicon wafer, alumina particles having an average particle diameter of 0.4 μm, and a nitrogen gas were used, respectively. The differential pressure between the aerosol generation chamber and the deposition chamber was not less than 26 kPa and not more than 30 kPa (flow rate of about 20 L/min).

TABLE 1

| Sample | 1 | 2 | 3 | 4 | 5 |
|---|---|---|---|---|---|
| β (deg) | 70 | 65 | 60 | 45 | 30 |
| α (deg) | 70 | 65 | 60 | 45 | 30 |
| Insulating properties | x | ○ | ○ | ○ | x |
| Film thickness (μm) | — | 2 | 4.1 | 3.7 | 8 |

The insulating properties were evaluated in two stages. In Table 1, "x" represents that a predetermined dielectric breakdown electric field intensity or a predetermined direct current electrical resistance (not less than 0.2 MV/cm or not less than $1 \times 10^9 \Omega$, respectively) was not achieved, and "○" represents that the predetermined dielectric breakdown electric field intensity or the predetermined direct current electrical resistance was achieved. It should be noted that "digital electrometer 8252" (manufactured by ADCMT) and a scanning electron microscope (manufactured by Hitach, Ltd.) were used to measure the insulating properties and the film thickness, respectively.

As shown in Table 1, regarding samples 2 to 4 in which α and β are not less than 45 degrees and not more than 65 degrees, alumina films having excellent insulating properties were obtained. In addition, regarding the samples 2 to 4, relatively high deposition rates of 200, 410, and 370 (nm/min) were achieved, respectively.

On the other hand, regarding samples 1 and 5 in which α and β are 70 degrees and 30 degrees, respectively, the obtained alumina films have low insulating properties. Regarding the sample 1, it was difficult to form a film by sputtering of the surface of the substrate.

In this experimental example, α and β are set to be the same angle. However, α and β may be set to be different angles. For example, it has been confirmed that an alumina film having favorable insulating properties is obtained under the conditions of α=40 degrees and β=60 degrees.

Hereinabove, embodiments of the present disclosure have been described. However, the embodiments of the present disclosure are not limited to the above-mentioned embodiments and various modifications can be made without departing from the gist of the present disclosure.

For example, in the above-mentioned embodiments, the direction in which the aerosol is injected from the nozzle and the in-plane direction of the substrate are each set to a horizontal direction. However, these directions are not limited thereto, and may be set to a direction vertical or diagonally to the horizontal direction.

The present disclosure contains subject matter related to that disclosed in Japanese Priority Patent Application JP 2014-130348 filed in the Japan Patent Office on Jun. 25, 2014, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A deposition method, comprising:
   introducing a gas into an airtight container containing electrically insulated raw material particles to generate an aerosol of the raw material particles;
   transferring the aerosol to a deposition chamber through a transfer tubing connected to the airtight container, the deposition chamber having a pressure maintained to be lower than that of the airtight container;
   injecting the aerosol from a nozzle mounted on a tip of the transfer tubing toward a target placed in the deposition chamber to cause the raw material particles to collide with the target, thereby causing the raw material particles to be positively charged;
   generating fine particles of the raw material particles by sputtering the raw material particles in a plasma generated by discharge of the charged raw material particles; and
   depositing the fine particles on a substrate placed in the deposition chamber, wherein the raw material particles injected from the nozzle are deflected from a first surface of the target to the substrate.

2. The deposition method according to claim 1, wherein the depositing includes reciprocating the substrate in an in-plane direction of the substrate, the substrate being arranged on an axis line passing through the first surface of the target, the axis line being in parallel with the first surface of the target.

3. The deposition method according to claim 1, wherein as the target, a conductive material is used.

4. The deposition method according to claim 1, wherein as the raw material particles, alumina fine particles or aluminum nitride fine particles are used.

5. The deposition method according to claim 1, wherein as the gas, at least one type of gas selected from the group consisting of nitrogen, argon, and oxygen is used.

* * * * *